United States Patent
Rath et al.

(10) Patent No.: US 9,422,513 B2
(45) Date of Patent: Aug. 23, 2016

(54) METAL AND DIELECTRIC COMPATIBLE SACRIFICIAL ANTI-REFLECTIVE COATING CLEANING AND REMOVAL COMPOSITION

(71) Applicant: ENTEGRIS, INC., Danbury, CT (US)

(72) Inventors: Melissa K. Rath, Redondo Beach, CA (US); David D. Bernhard, Kooskia, ID (US); Thomas H. Baum, New Fairfield, CT (US); David W. Minsek, New Milford, CT (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 0 days.

(21) Appl. No.: 14/558,071

(22) Filed: Dec. 2, 2014

(65) Prior Publication Data

US 2015/0094248 A1   Apr. 2, 2015

Related U.S. Application Data

(63) Continuation of application No. 11/916,891, filed as application No. PCT/US2006/022049 on Jun. 7, 2006.

(60) Provisional application No. 60/688,204, filed on Jun. 7, 2005.

(51) Int. Cl.
| | | |
|---|---|---|
| C11D 7/32 | (2006.01) | |
| C11D 11/00 | (2006.01) | |
| C11D 7/50 | (2006.01) | |
| G03F 7/42 | (2006.01) | |
| C11D 7/08 | (2006.01) | |
| C11D 7/10 | (2006.01) | |
| C11D 7/26 | (2006.01) | |
| C11D 7/28 | (2006.01) | |
| C11D 7/34 | (2006.01) | |

(52) U.S. Cl.
CPC ............ *C11D 11/0047* (2013.01); *C11D 7/08* (2013.01); *C11D 7/10* (2013.01); *C11D 7/261* (2013.01); *C11D 7/263* (2013.01); *C11D 7/265* (2013.01); *C11D 7/28* (2013.01); *C11D 7/34* (2013.01); *C11D 7/50* (2013.01); *G03F 7/423* (2013.01)

(58) Field of Classification Search
CPC ............ C11D 7/00; C11D 7/02; C11D 7/04; C11D 7/22; C11D 7/26; C11D 7/261; C11D 7/28; C11D 7/50
USPC .......................... 510/175, 176, 245, 255, 257
See application file for complete search history.

(56) References Cited

U.S. PATENT DOCUMENTS

| | | | |
|---|---|---|---|
| 4,343,677 A | 8/1982 | Kinsbron et al. | |
| 5,320,709 A | 6/1994 | Bowden et al. | |
| 5,571,447 A | 11/1996 | Ward et al. | |
| 5,630,904 A | 5/1997 | Aoyama et al. | |
| 5,698,503 A | 12/1997 | Ward et al. | |
| 5,792,274 A | 8/1998 | Tanabe et al. | |
| 5,883,060 A * | 3/1999 | Lim et al. ................. | 510/175 |
| 5,905,063 A | 5/1999 | Tanabe et al. | |
| 5,962,385 A | 10/1999 | Maruyama et al. | |
| 6,044,851 A | 4/2000 | Grieger et al. | |
| 6,194,366 B1 | 2/2001 | Naghshineh et al. | |
| 6,211,126 B1 | 4/2001 | Wojtczak et al. | |
| 6,224,785 B1 | 5/2001 | Wojtczak et al. | |
| 6,235,693 B1 | 5/2001 | Cheng et al. | |
| 6,248,704 B1 | 6/2001 | Small et al. | |
| 6,265,309 B1 | 7/2001 | Gotoh et al. | |
| 6,268,457 B1 | 7/2001 | Kennedy et al. | |
| 6,280,651 B1 | 8/2001 | Wojtczak et al. | |
| 6,306,807 B1 | 10/2001 | Wojtczak et al. | |
| 6,323,169 B1 | 11/2001 | Abe et al. | |
| 6,344,432 B1 | 2/2002 | Wojtczak et al. | |
| 6,365,529 B1 | 4/2002 | Hussein et al. | |
| 6,365,765 B1 | 4/2002 | Baldwin et al. | |
| 6,383,410 B1 | 5/2002 | Wojtczak et al. | |
| 6,395,194 B1 | 5/2002 | Russell et al. | |
| 6,492,308 B1 | 12/2002 | Naghshineh et al. | |
| 6,566,315 B2 | 5/2003 | Wojtczak et al. | |
| 6,627,587 B2 | 9/2003 | Naghshineh et al. | |
| 6,723,691 B2 | 4/2004 | Naghshineh et al. | |
| 6,755,989 B2 | 6/2004 | Wojtczak et al. | |
| 6,773,873 B2 | 8/2004 | Seijo et al. | |
| 6,807,824 B1 | 10/2004 | Miwa | |

(Continued)

FOREIGN PATENT DOCUMENTS

| | | |
|---|---|---|
| EP | 1035446 A2 | 9/2009 |
| GB | 2354086 A | 3/2001 |

(Continued)

OTHER PUBLICATIONS

Taiwanese Search Report, Nov. 5, 2014.
European Search Report, Jun. 26, 2014.
Korean Office Action, Jul. 1, 2013.

*Primary Examiner* — Jane L Stanley
(74) *Attorney, Agent, or Firm* — Tristan A. Fuierer; Moore & Van Allen, PLLC

(57) ABSTRACT

A liquid removal composition and process for removing sacrificial anti-reflective coating (SARC) material from a substrate having same thereon. The liquid removal composition includes at least one fluoride-containing compound, at least one organic solvent, optionally water, and optionally at least one chelating agent. The composition achieves at least partial removal of SARC material in the manufacture of integrated circuitry with minimal etching of metal species on the substrate, such as aluminum, copper and cobalt alloys, and without damage to low-k dielectric materials employed in the semiconductor architecture.

14 Claims, No Drawings

(56) References Cited

U.S. PATENT DOCUMENTS

| | | |
|---|---|---|
| 6,849,200 B2 | 2/2005 | Baum et al. |
| 6,896,826 B2 | 5/2005 | Wojtczak et al. |
| 7,276,181 B2 | 10/2007 | Miwa |
| 8,030,263 B2 | 10/2011 | Egbe et al. |
| 2002/0146647 A1 | 10/2002 | Aoki et al. |
| 2003/0022800 A1* | 1/2003 | Peters .................... C11D 7/28 510/175 |
| 2003/0082912 A1 | 5/2003 | Kezuka et al. |
| 2003/0130147 A1 | 7/2003 | Koito et al. |
| 2003/0171239 A1 | 9/2003 | Patel et al. |
| 2003/0181342 A1* | 9/2003 | Seijo et al. .................... 510/175 |
| 2004/0029753 A1 | 2/2004 | Ikemoto et al. |
| 2004/0050406 A1 | 3/2004 | Sehgal |
| 2004/0144399 A1* | 7/2004 | McDermott ............ B08B 3/12 134/1 |
| 2004/0149309 A1 | 8/2004 | Hsu |
| 2004/0180300 A1 | 9/2004 | Minsek et al. |
| 2005/0014667 A1 | 1/2005 | Aoyama et al. |
| 2005/0029229 A1 | 2/2005 | Chae et al. |
| 2005/0176602 A1 | 8/2005 | Hsu |
| 2005/0197265 A1 | 9/2005 | Rath et al. |
| 2005/0215183 A1 | 9/2005 | Siddiqui et al. |
| 2005/0239673 A1* | 10/2005 | Hsu ...................... C11D 3/2068 510/176 |
| 2005/0245082 A1 | 11/2005 | Perng et al. |
| 2005/0255386 A1 | 11/2005 | Kim et al. |
| 2005/0266683 A1 | 12/2005 | Lee |
| 2005/0275060 A1 | 12/2005 | Dokumaci et al. |
| 2006/0063687 A1 | 3/2006 | Minsek et al. |
| 2006/0138399 A1 | 6/2006 | Itano et al. |
| 2006/0154186 A1 | 7/2006 | Minsek et al. |
| 2006/0166847 A1 | 7/2006 | Walker et al. |
| 2006/0229221 A1 | 10/2006 | Walker et al. |
| 2006/0255315 A1 | 11/2006 | Yellowaga et al. |
| 2007/0179072 A1* | 8/2007 | Rao ........................ C11D 7/08 510/175 |
| 2008/0006305 A1 | 1/2008 | Bernhard et al. |
| 2008/0242574 A1 | 10/2008 | Rath et al. |
| 2010/0056410 A1 | 3/2010 | Visintin et al. |
| 2011/0311921 A1 | 12/2011 | Egbe et al. |

FOREIGN PATENT DOCUMENTS

| | | | |
|---|---|---|---|
| KR | 1020050012770 | 2/2005 | |
| WO | WO 2004019134 A1 * | 3/2004 | ............... C11D 7/08 |
| WO | 2004094581 A1 | 11/2004 | |
| WO | 2006054996 A1 | 5/2006 | |

\* cited by examiner

METAL AND DIELECTRIC COMPATIBLE SACRIFICIAL ANTI-REFLECTIVE COATING CLEANING AND REMOVAL COMPOSITION

CROSS-REFERENCE TO RELATED APPLICATIONS

This application is filed under the provisions of 35 U.S.C. §120 and claims priority of U.S. patent application Ser. No. 11/916,891 filed on Jun. 5, 2008 in the name of Melissa K. Rath, et al. entitled "METAL AND DIELECTRIC COMPATIBLE SACRIFICIAL ANTI-REFLECTIVE COATING CLEANING AND REMOVAL COMPOSITION," which claims the priority of International Patent Application No. PCT/US2006/022049 filed on 7 Jun. 2006, which claims priority to U.S. Provisional Patent Application No. 60/688,204 filed on 7 Jun. 2005, all of which are incorporated by reference in their respective entirety herein

FIELD OF THE INVENTION

The present invention relates to a liquid removal composition and process useful for silicate stripping, e.g., liquid removal of sacrificial anti-reflective silicate material and/or post-etch residue from a microelectronic device having such material deposited thereon, particularly where the sacrificial anti-reflective silicate material is present with underlying silicate materials and interconnect metals, e.g., aluminum, copper and cobalt alloy, desired to be unaffected by the liquid removal composition.

DESCRIPTION OF THE RELATED ART

Currently, there are four developed wavelengths of radiation used in the photolithographic industry—436 nm, 365 nm, 248 nm, and 193 nm—and recent efforts have focused on 157 nm lithography processes. In theory, with each wavelength decrease, smaller features can be created on the semiconductor chip. However, because the reflectivity of the microelectronic device substrate is inversely proportional to the photolithographic wavelength, interference and unevenly exposed photoresist have limited the consistency of the critical dimensions of the microelectronic device.

For example, upon exposure to DUV radiation, it is well known that the transmissivity of photoresist combined with the high reflectivity of the substrate to the DUV wavelengths results in the reflection of the DUV radiation back into the photoresist thereby producing standing waves in the photoresist layer. The standing waves trigger further photochemical reactions in the photoresist causing an uneven exposure of the photoresist, including in the masked portions not intended to be exposed to the radiation, which results in variations in linewidths, spacing, and other critical dimensions.

In order to address the transmissivity and reflectivity problems, bi- and tri-layer photoresists, bottom anti-reflective coatings (BARCs) and sacrificial anti-reflective coatings (SARCs) have been developed; these coatings are applied to substrates prior to applying the photoresist. All of these antireflective coatings have a planarizing effect on wafer surfaces encountered in typical dual damascene integration and all incorporate a UV chromophore into a spin-on polymer matrix which will absorb incident UV radiation.

When used with SiOC-based dielectrics, SARCs have two important advantages: SARCs are TEOS-based and thus etch at the same rate as SiOC dielectrics, which allows for much greater etch uniformity and control such that the trench etch stop can be eliminated and via etch stop can be reduced in thickness by up to 50%; and etched SARCs can be removed using liquid removal compositions because there is not a significant increase in post-etch cross-linking in etched SARCs relative to etched photoresist and etched BARCs.

The clean removal of SARC materials from the microelectronic device wafer has proven to be difficult and/or costly. If not removed, the layers may interfere with subsequent silicidation or contact formation. Typically, the layers are removed by oxidative or reductive plasma ashing or wet cleaning. However, plasma ashing, whereby the substrate is exposed to an oxidative or reductive plasma etch, may result in damage to the dielectric material, either by changing the feature shapes and dimensions, or by increasing the dielectric constant. The latter problem is more pronounced when low-k dielectric materials, such as organosilicate glasses (OSG) or carbon-doped oxide glasses, are the underlying dielectric material. As such, it is often desirable to avoid the use of plasma ashing to remove the SARC layers.

When a cleaner/etchant composition is used in back-end-of-line (BEOL) applications to process aluminum, copper, cobalt alloy or other interconnect metal or interconnect barrier separated by low capacitance (low-k) insulating material or dielectric, it is important that the compositions used to remove SARCs possess good metal compatibility, e.g., a low etch rate on copper, aluminum, cobalt, etc., and that the underlying silicate materials remain unaffected by the cleaner composition. Aqueous removal solutions are preferred because of the simpler disposal techniques, however, aqueous removal solutions are known to etch or corrode the metal interconnects.

Accordingly, there is a need in the art for removal compositions having low water content which can completely and efficiently remove SARC layers from the surface of the microelectronic device while simultaneously minimizing damage to the co-extensively present dielectric materials and/or interconnect metals.

SUMMARY OF THE INVENTION

The present invention relates to a liquid removal composition and process useful for the removal of sacrificial anti-reflective silicate material from the surface of a microelectronic device having such material deposited thereon, particularly where the sacrificial anti-reflective silicate material is present with underlying silicate materials and interconnect metals desired to be unaffected by the liquid removal composition. Specifically, the present invention relates to aluminum, copper and cobalt alloy compatible SARC removal compositions.

In one aspect, the invention relates to a liquid removal composition, comprising at least one fluoride-containing compound, at least one organic solvent, optionally water, and optionally at least one chelating agent, wherein said liquid removal composition is useful for removing sacrificial anti-reflective coating (SARC) materials and/or post-etch residue from a microelectronic device having such materials and residue thereon.

In another aspect, the invention relates to a kit comprising, in one or more containers, liquid removal composition reagents, wherein the liquid removal composition comprises at least one fluoride-containing compound, at least one organic solvent, optionally water, and optionally at least one chelating agent, and wherein the kit is adapted to form a liquid removal composition suitable for removing SARC material and/or post-etch residue from a microelectronic device having said material and residue thereon.

In a further aspect, the invention relates to a method of removing SARC material and/or post-etch residue from a microelectronic device having said material and residue thereon, said method comprising contacting the microelectronic device with a liquid removal composition for sufficient time to at least partially remove said material and residue from the microelectronic device, wherein the liquid removal composition comprises at least one fluoride-containing compound, at least one organic solvent, optionally water, and optionally at least one chelating agent.

In yet another aspect, the invention relates to a liquid removal composition, comprising at least one fluoride-containing compound, optionally at least one organic solvent, optionally an acid-base buffer, optionally at least one chelator/passivation agent, and optionally water, wherein said liquid removal composition is useful for removing sacrificial anti-reflective coating (SARC) materials from a microelectronic device having such materials and residue thereon.

In another aspect, the invention relates to a kit comprising, in one or more containers, liquid removal composition reagents, wherein the liquid removal composition comprises at least one fluoride-containing compound, optionally at least one organic solvent, optionally an acid-base buffer, optionally at least one chelator/passivation agent, and optionally water, and wherein the kit is adapted to form a liquid removal composition suitable for removing SARC material from a microelectronic device having said material thereon.

In a further aspect, the invention relates to a method of removing SARC material from a microelectronic device having said material thereon, said method comprising contacting the microelectronic device with a liquid removal composition for sufficient time to at least partially remove said material from the microelectronic device, wherein the liquid removal composition comprises at least one fluoride-containing compound, optionally at least one organic solvent, optionally an acid-base buffer, optionally at least one chelator/passivation agent, and optionally water.

In another aspect, the present invention relates to a method of manufacturing a microelectronic device, said method comprising contacting the microelectronic device with a liquid removal composition for sufficient time to at least partially remove SARC material and/or post-etch residue from the microelectronic device having said material and residue thereon, wherein the liquid removal composition includes at least one fluoride-containing compound, at least one organic solvent, optionally water, and optionally at least one chelating agent.

Yet another aspect of the invention relates to improved microelectronic devices, and products incorporating the same, made using the methods of the invention comprising at least partial removal of SARC and post-etch residue from the microelectronic device having said material(s) thereon, using the methods and/or compositions described herein, and optionally, incorporating the microelectronic device into a product.

Other aspects, features, and embodiments of the invention will be more fully apparent from the ensuing disclosure and appended claims.

DETAILED DESCRIPTION OF THE INVENTION, AND PREFERRED EMBODIMENTS THEREOF

The present invention contemplates liquid removal compositions that are useful to remove sacrificial anti-reflective coating (SARC) materials and/or post-etch residue from the surface of a microelectronic device having such material(s) thereon.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As used herein, "about" is intended to correspond to ±5% of the stated value.

As used herein, "suitability" for removing SARC materials and/or post-etch residue from a microelectronic device having said material(s) thereon corresponds to at least partial removal of said SARC and/or post-etch residue material(s) from the microelectronic device. Preferably, at least about 90% of the material(s), more preferably at least 95% of the material(s), and most preferably at least 99% of the material(s), are removed from the microelectronic device using the compositions of the invention.

"Post-etch residue," as used herein, corresponds to material remaining following gas-phase plasma etching processes, e.g., BEOL dual damascene processing. The post-etch residue may be organic, organometallic, organosilicic, or inorganic in nature, for example, silicon-containing material, carbon-based organic material, and etch gas residue including, but not limited to, chlorine and fluorine.

As defined herein, "SARC materials" corresponds to bi- and tri-layer photoresists, bottom anti-reflective coatings (BARCs) and sacrificial anti-reflective coatings (SARCs) and can be organic and/or inorganic in nature. In addition, SARC materials may include SARC layers and/or SARC-containing residues.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Embodiment A

In one aspect, the present invention relates to liquid removal compositions useful in removing SARC layers and/or post-etch residue from a microelectronic device. Specific reference to SARC layers hereinafter in the broad description of the invention is meant to provide an illustrative example of the present invention and is not meant to limit same in any way. The formulation of embodiment A includes at least one fluoride-containing compound, at least one organic solvent, optionally water, and optionally at least one chelator/passivation agent, present in the following ranges, based on the total weight of the composition:

| component of | % by weight |
| --- | --- |
| fluoride-containing compound(s) | about 0.01% to about 25.0% |
| organic solvent(s) | about 0.01% to about 99.9% |
| chelator/passivation agent(s) | 0% to about 10.0% |
| Water | 0% to about 10.0% |

In the broad practice of the invention, the liquid removal composition of embodiment A may comprise, consist of, or consist essentially of at least one fluoride-containing compound, at least one organic solvent, optionally water, and optionally at least one chelator/passivation agent. In general, the specific proportions and amounts of fluoride-containing compound(s), organic solvent(s), optional water, and optional chelator/passivation agent(s), in relation to each other, may be suitably varied to provide the desired removal action of the liquid composition for the SARC layer species and/or processing equipment, as readily determinable within the skill of the art without undue effort.

The range of mole ratios for organic solvent(s) relative to fluoride-containing compound(s) is about 1:1 to about 120:1, preferably about 20:1 to about 80:1, and most preferably about 30:1 to about 65:1; the range of mole ratios for organic solvent(s) relative to water (when present) is about 1:1 to about 150:1, preferably about 20:1 to about 80:1, and most preferably about 30:1 to about 60:1; and the range of mole ratios for organic solvent(s) relative to chelating agent(s) (when present) is about 1:1 to about 300:1.

Compositions of embodiment A preferably have a pH value in a range from about 1 to about 5, more preferably less than about 4.

Such composition may optionally include additional components, including active as well as inactive ingredients, e.g., surfactants, stabilizers, dispersants, anti-oxidants, penetration agents, adjuvants, additives, fillers, excipients, etc. In addition, it is also contemplated herein that the compositions of embodiment A may be formulated as foams, fogs, subcritical or supercritical fluids. For example, the compositions of embodiment A may be added to a supercritical fluid such as carbon dioxide in a ratio of about 100 parts SCF to 1 part embodiment A to about 6:1, preferably about 20:1.

Preferably, the embodiment A cleaning composition includes the following components:

| component of | % by weight |
| --- | --- |
| fluoride-containing compound(s) | about 0.01% to about 5.0% |
| organic solvent(s) | about 90.0% to about 99.9% |
| Water | about 0% to about 5.0% | wherein percentages of the components are percentages by weight, based on total weight of the composition, and wherein the total of the weight percentages of such components of the composition does not exceed 100 weight %. In a particularly preferred embodiment, water is present in an amount in a range from about 0.01 wt. % to about 1 wt. %, is de-ionized and non-ozonated, and is either added to the composition or residually present in one of the other components. In addition, preferably, the composition is substantially devoid of choline compounds and oxidizing agents such as hydrogen peroxide.

A source of fluoride ion is needed since the presence of fluoride is necessary to etch silicate materials in acidic solutions. Suitable sources of fluoride-containing compounds include, but are not limited to, hydrogen fluoride, ammonium fluoride, and triethanolamine hydrofluoric acid salt. Alternatively, salts of bifluorides may be used, including ammonium bifluoride (($NH_4$)$HF_2$) and tetraalkylammonium bifluorides (($R$)$_4NHF_2$, where R is methyl, ethyl, propyl, butyl, phenyl, benzyl, or fluorinated $C_1$-$C_4$ alkyl groups). Combinations of two or more fluoride species is also contemplated herein. In a preferred embodiment, the fluoride-containing compound includes hydrogen fluoride. Notably, hydrogen fluoride is typically shipped with residual quantities of water and as such, water may be present in the removal composition even though no water is intentionally added thereafter. Alternatively, gaseous anhydrous hydrogen fluoride may be used so that the only water present in the formulation is trace water originating from the solvents. Anhydrous hydrogen fluoride-containing formulations typically display better metal and dielectric compatibility than water-containing formulations.

The organic solvent species serve as a solvent and assist in the dissolution of organic residues that may be present in the SARC and/or post-etch residue. Suitable solvent species for such composition include, without limitation: tetramethylene sulfone; straight-chained or branched $C_1$-$C_6$ alcohols including, but not limited to, methanol, ethanol, 1-propanol, 2-propanol, 1-butanol, 2-butanol, t-butanol, 1-pentanol, and hexanol; glycols such as ethylene glycol, propylene glycol (1,2-propanediol), tetramethylene glycol (1,4-butanediol) and neopentyl glycol; or glycol ethers such as diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, and tripropylene glycol n-butyl ether. Other solvents that are useful are typical polar solvents such dimethylacetamide, formamide, dimethylformamide, 1-methyl-2-pyrrolidinone, dimethyl sulfoxide, and other polar solvents. Combinations of two or more solvent species are also contemplated herein. For porous low-k dielectric materials, the organic solvent species preferably includes 1-butanol and 1,4-butanediol. The most preferable cleaning solution for dense dielectrics is a combination of glycols, polar solvent and glycol ether, more preferably, ethylene glycol, tetramethylene sulfone and tripropylene glycol methyl ether or ethylene glycol, tetramethylene sulfone and dipropylene glycol n-butyl ether.

The chelating agent(s) may be added to reduce the attack on the metals, e.g., copper and/or cobalt, in the underlying layers. The chelator/passivation agent in such composition may be of any suitable type, and may include, without limitation, triazoles, such as 1,2,4-triazole, or triazoles substituted with substituents such as $C_1$-$C_8$ alkyl, amino, thiol, mercapto, imino, carboxy and nitro groups, such as benzotriazole, tolyltriazole, 5-phenyl-benzotriazole, 5-nitro-benzotriazole, 3-amino-5-mercapto-1,2,4-triazole, 1-amino-1,2, 4-triazole, hydroxybenzotriazole, 2-(5-amino-pentyl)-benzotriazole, 1-amino-1,2,3-triazole, 1-amino-5-methyl-1, 2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like, as well as thiazoles, tetrazoles, imidazoles, phosphates, thiols and azines such as 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, etc. Suitable chelator species further include glycerols, amino acids, carboxylic acids, alcohols, amides and quinolines such as guanine, adenine, glycerol, thioglycerol, nitrilotriacetic acid, salicylamide, iminodiacetic acid, benzoguanamine, melamine, thiocyranuric acid, anthranilic acid, gallic acid, ascorbic acid, salicylic acid, 8-hydroxyquinoline, 5-carboxylic acid-benzotriazole, 3-mercaptopropanol, boric acid, iminodiacetic acid, etc. Combinations of two or more chelating agents are also contemplated herein. The chelator is usefully employed to increase the compatibility of the composition with the metals and the dielectric materials used in the microelectronic device.

In various preferred embodiments, the removal composition of embodiment A is formulated in the following embodiments A1-A7, wherein all percentages are by weight, based on the total weight of the formulation:

| component of | % by weight | preferably (% by weight) | most preferably (% by weight) |
|---|---|---|---|
| Embodiment A1 | | | |
| fluoride-containing compound(s) | about 0.01% to about 25% | about 0.01% to about 5% | about 0.25% to about 1% |
| alcohol(s) | about 0.01% to about 99.9% | about 50% to about 99.9% | about 98% to about 99% |
| Water | about 0.01% to about 10% | about 0.01% to about 5% | about 0.25% to about 1% |
| Embodiment A2 | | | |
| fluoride-containing compound(s) | about 0.01% to about 25% | about 0.01% to about 5% | about 0.25% to about 0.75% |
| alcohol(s) | about 0.01% to about 99% | about 50% to about 95% | about 73.5% to about 74.5% |
| glycol ether(s) | about 0.01% to about 99% | about 5% to about 40% | about 25% |
| Water | about 0.01% to about 10% | about 0.01% to about 5% | about 0.25% to about 0.75% |
| Embodiment A3 | | | |
| fluoride-containing compound(s) | about 0.01% to about 25% | about 0.01% to about 5% | about 0.35% to about 0.75% |
| alcohol(s) | about 0.01% to about 99% | about 5% to about 90% | about 8.5% to about 73.5% |
| glycol(s) | about 0.01% to about 99% | about 10% to about 99% | about 25% to about 90% |
| Water | about 0.01% to about 10% | about 0.01% to about 5% | about 0.35% to about 0.8% |
| Embodiment A4 | | | |
| fluoride-containing compound(s) | about 0.01% to about 25% | about 0.01% to about 5% | about 0.35% to about 0.4% |
| alcohol(s) | about 0.01% to about 99% | about 5% to about 60% | about 10% to about 49.5% |
| 1,4-butanediol | about 0.01% to about 99% | about 30% to about 99% | about 50% to about 89.5% |
| Water | about 0.01% to about 10% | about 0.01% to about 5% | about 0.35% to about 0.4% |
| Embodiment A5 | | | |
| fluoride-containing compound(s) | about 0.01% to about 25% | about 0.01% to about 5% | about 0.25% to about 1% |
| glycol(s) | about 0.01% to about 99.9% | about 50% to about 99.9% | about 98% to about 99.5% |
| Water | about 0.01% to about 10% | about 0.01% to about 5% | about 0.25% to about 1% |
| Embodiment A6 | | | |
| fluoride-containing compound(s) | about 0.01% to about 25% | about 0.01% to about 5% | about 0.35% to about 0.65% |
| tetramethylene sulfone | about 0.01% to about 99% | about 20% to about 70% | about 35% to about 50% |
| glycol(s) | about 0.01% to about 99% | about 30% to about 99% | about 49% to about 64.5 |
| Water | about 0.01% to about 10% | about 0.01% to about 5% | about 0.35% to about 0.65% |

| component of | % by weight | preferably (% by weight) | most preferably (% by weight) |
|---|---|---|---|
| Embodiment A7 | | | |
| fluoride-containing compound(s) | about 0.01% to about 25% | about 0.01% to about 5% | about 0.35% to about 0.4% |
| tetramethylene sulfone | about 0.01% to about 99% | about 20% to about 60% | about 35% to about 40% |
| glycol(s) | about 0.01% to about 99% | about 20% to about 70% | about 40% to about 50% |
| glycol ether(s) | about 0.01% to about 99% | about 5% to about 30% | about 15% to about 20% |
| additional components | 0 to about 5% | 0 to about 1% | 0 to about 0.2% |

In various preferred embodiments, the removal composition of embodiment A is formulated in the following Formulations AA-AI$^3$, wherein all percentages are by weight, based on the total weight of the formulation:

Formulation AA: 99.5% ethanol; 0.245% hydrogen fluoride; 0.255% water
Formulation AB: 98.5% ethanol; 0.735% hydrogen fluoride; 0.765% water
Formulation AC: 74.5% ethanol; 25.0% dipropylene glycol methyl ether; 0.245% hydrogen fluoride; 0.255% water
Formulation AD: 73.5% ethanol; 25.0% dipropylene glycol methyl ether; 0.735% hydrogen fluoride; 0.765% water
Formulation AE: 74.5% ethanol; 25.0% diethylene glycol methyl ether; 0.245% hydrogen fluoride; 0.255% water
Formulation AF: 73.5% ethanol; 25.0% diethylene glycol methyl ether; 0.735% hydrogen fluoride; 0.765% water
Formulation AG: 98.0% ethanol; 0.98% hydrogen fluoride; 1.02% water
Formulation AH: 98.5% methanol; 0.735% hydrogen fluoride; 0.765% water
Formulation AI: 98.5% ethylene glycol; 0.735% hydrogen fluoride; 0.765% water
Formulation AJ: 98.5% propylene glycol; 0.735% hydrogen fluoride; 0.765% water
Formulation AK: 98.5% diethylene glycol butyl ether; 0.735% hydrogen fluoride; 0.765% water
Formulation AL: 98.5% 2-propanol; 0.735% hydrogen fluoride; 0.765% water
Formulation AM: 98.5% 1,4-butanediol; 0.735% hydrogen fluoride; 0.765% water
Formulation AN: 98.5% 1-propanol; 0.735% hydrogen fluoride; 0.765% water
Formulation AO: 98.5% 1-pentanol; 0.735% hydrogen fluoride; 0.765% water
Formulation AP: 25.0% ethylene glycol; 73.5% 1-butanol; 0.735% hydrogen fluoride; 0.765% water
Formulation AQ: 98.5% 1-butanol; 0.735% hydrogen fluoride; 0.765% water
Formulation AR: 50.0% ethylene glycol; 48.5% 1-butanol; 0.735% hydrogen fluoride; 0.765% water
Formulation AS: 75.0% ethylene glycol; 23.5% 1-butanol; 0.735% hydrogen fluoride; 0.765% water
Formulation AT: 25.0% ethylene glycol; 73.5% ethanol; 0.735% hydrogen fluoride; 0.765% water
Formulation AU: 50.0% ethylene glycol; 48.5% ethanol; 0.735% hydrogen fluoride; 0.765% water
Formulation AV: 75.0% ethylene glycol; 23.5% ethanol; 0.735% hydrogen fluoride; 0.765% water
Formulation AW: 70.0% ethylene glycol; 28.5% 1-butanol; 0.735% hydrogen fluoride; 0.765% water
Formulation AX: 50.0% ethylene glycol; 48.5% 1-butanol; 0.735% hydrogen fluoride; 0.765% water
Formulation AY: 75.0% ethylene glycol; 23.5% 1,4-butanediol; 0.735% hydrogen fluoride; 0.765% water
Formulation AZ: 60.0% ethylene glycol; 38.5% 1-pentanol; 0.735% hydrogen fluoride; 0.765% water
Formulation AA$^2$: 50.0% ethylene glycol; 48.5% 1-pentanol; 0.735% hydrogen fluoride; 0.765% water
Formulation AB$^2$: 80.0% ethylene glycol; 18.5% 1-pentanol; 0.735% hydrogen fluoride; 0.765% water
Formulation AC$^2$: 90.0% ethylene glycol; 8.5% 1-pentanol; 0.735% hydrogen fluoride; 0.765% water
Formulation AD$^2$: 99.25% 1,4-butanediol; 0.3675% hydrogen fluoride; 0.3825% water
Formulation AE$^2$: 90.0% ethylene glycol; 9.25% 1-pentanol; 0.3675% hydrogen fluoride; 0.3825% water
Formulation AF$^2$: 99.51% 1,4-butanediol; 0.49% hydrogen fluoride
Formulation AG$^2$: 99.265% 1,4-butanediol; 0.735% hydrogen fluoride
Formulation AH$^2$: 89.25% 1,4-butanediol; 10.0% 1-butanol; 0.3675% hydrogen fluoride; 0.3825% water
Formulation AI$^2$: 80.0% 1,4-butanediol; 19.25% 1-butanol; 0.3675% hydrogen fluoride; 0.3825% water
Formulation AJ$^2$: 70.0% 1,4-butanediol; 29.25% 1-butanol; 0.3675% hydrogen fluoride; 0.3825% water
Formulation AK$^2$: 60.0% 1,4-butanediol; 39.25% 1-butanol; 0.3675% hydrogen fluoride; 0.3825% water
Formulation AL$^2$: 50.0% 1,4-butanediol; 49.25% 1-butanol; 0.3675% hydrogen fluoride; 0.3825% water
Formulation AM$^2$: 98.875% 1,4-butanediol; 0.55125% hydrogen fluoride; 0.57375% water

| Solution | Tetramethylene Sulfone | Hydrofluoric Acid | Water | Ethylene Glycol |
|---|---|---|---|---|
| AN$^2$ | 35% | 0.3675% | 0.3825% | 64.25% |
| AO$^2$ | 35% | 0.6125% | 0.6375% | 63.75% |
| AP$^2$ | 45% | 0.3675% | 0.3825% | 54.25% |
| AQ$^2$ | 45% | 0.6125% | 0.6375% | 53.75% |
| AR$^2$ | 40% | 0.49% | 0.51% | 59% |
| AS$^2$ | 40% | 0.49% | 0.51% | 59% |
| AT$^2$ | 35% | 0.49% | 0.51% | 64% |
| AU$^2$ | 45% | 0.49% | 0.51% | 54% |
| AV$^2$ | 40% | 0.3675% | 0.3825% | 59.25% |
| AW$^2$ | 40% | 0.6125% | 0.6375% | 58.75% |
| AX$^2$ | 50% | 0.3675% | 0.3825% | 49.25% |

Formulation AY$^2$: 79.25% ethanol; 20% 1-methyl-2-pyrrolidinone; 0.3675% hydrogen fluoride; 0.3825% water
Formulation AZ$^2$: 79.25% ethylene glycol; 20% dimethylacetamide; 0.3675% hydrogen fluoride; 0.3825% water Formulation AA[3]: 99.25% tetramethylene sulfone; 0.3675% hydrogen fluoride; 0.3825% water
Formulation AB[3]: 50% ethylene glycol; 49.25% tetramethylene sulfone; 0.3675% hydrogen fluoride; 0.3825% water
Formulation AC[3]: 50% ethylene glycol; 49.625% tetramethylene sulfone; 0.375% hydrogen fluoride
Formulation AD[3]: 45% ethylene glycol; 39.625% tetramethylene sulfone; 15% tripropylene glycol methyl ether; 0.375% hydrogen fluoride
Formulation AE[3]: 45% ethylene glycol; 34.625% tetramethylene sulfone; 20% tripropylene glycol methyl ether; 0.375% hydrogen fluoride
Formulation AF[3]: 45% ethylene glycol; 39.625% tetramethylene sulfone; 15% dipropylene glycol n-butyl ether; 0.375% hydrogen fluoride
Formulation AG[3]: 45% ethylene glycol; 39.625% tetramethylene sulfone; 15% dipropylene glycol methyl ether; 0.375% hydrogen fluoride
Formulation AH[3]: 70.0% 1,4-butanediol; 29.25% 1-butanol; 0.3675% hydrogen fluoride; 0.3825% water
Formulation AI[3]: 44.882% ethylene glycol; 15% di(propylene glycol)butyl ether; 39.64% sulfolane; 0.375% HF; 0.1% polyquaternium 2; 0.003% tetramethylammonium hydroxide silicate Preferably, the liquid removal composition of embodiment A includes 1,4-butanediol and 1-butanol for maximum porous low-k dielectric compatibility. Most preferably, the liquid removal composition corresponds to Formulation AL[2], AM[2], AH[3], and AI[3].

The compositions of embodiment A are particularly effective at removing SARC layers and post-etch residue from a microelectronic device substrate with minimal damage to the metal interconnecting species and/or the low-k dielectric material. Metals of interest include, but are not limited to, copper, tungsten, cobalt, aluminum, tantalum and ruthenium. In addition, it is contemplated herein that the compositions of embodiment A may be diluted with a solvent such as water and used as a post-chemical mechanical polishing (CMP) composition to remove post-CMP residue including, but not limited to, particles from the polishing slurry, carbon-rich particles, polishing pad particles, brush deloading particles, equipment materials of construction particles, copper, copper oxides, and any other materials that are the by-products of the CMP process.

In another embodiment, the liquid removal composition of embodiment A includes ethylene glycol, tetramethylene sulfone and a glycol ether for maximum dense dielectric compatibility. Most preferably, the liquid removal composition corresponds to Formulation AS[2] or AV[2].

In yet another embodiment, the liquid removal composition of embodiment A includes at least one fluoride-containing compound, at least one organic solvent, for residue material removal, optionally water, and optionally at least one chelator/passivation agent, wherein the residue material includes SARC and/or post-etch residue. Importantly, the residue material may be dissolved and/or suspended in the liquid removal composition of the invention.

The liquid removal compositions of the invention are easily formulated by simple addition of the respective ingredients and mixing to homogeneous condition. Furthermore, the liquid removal compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the liquid removal composition, i.e., more dilute or more concentrated, in the broad practice of the invention, and it will be appreciated that the liquid removal compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions of the invention. For example, the kit may include, in one or more containers, at least one fluoride-containing compound, at least one organic solvent, and optionally, at least one chelator/passivation agent, for combining with optional water at the fab or the point of use. Alternatively, the kit may include, in one or more containers, at least one fluoride-containing compound, and optionally, at least one chelator/passivation agent, for combining with the at least one solvent and optional water at the fab or the point of use. In still another embodiment, the kit may include, in one or more containers, at least one fluoride-containing compound, at least one organic solvent, and water, for delivery to the fab or point of use. The containers of the kit must be suitable for storing and shipping said liquid removal compositions, for example, NOWPak® containers (Advanced Technology Materials, Inc., Danbury, Conn., USA).

Embodiment B

In another aspect, the formulation of the present invention includes at least one fluoride-containing compound, optionally at least one organic solvent, optionally an acid-base buffer, optionally at least one chelator/passivation agent, and optionally water, present in the following ranges, based on the total weight of the composition:

| component of | % by weight |
| --- | --- |
| fluoride-containing compound(s) | about 0.01% to about 70.0% |
| organic solvent(s) | about 0.01 to about 80.0% |
| acid/base buffer | 0 to about 30% |
| chelator/passivation agent(s) | 0% to about 10.0% |
| water | 0% to about 30.0% |

In the broad practice of the invention, the liquid removal composition of embodiment B may comprise, consist of, or consist essentially of at least one fluoride-containing compound, optionally at least one organic solvent, optionally an acid-base buffer, and optionally at least one chelator/passivation agent, and optionally water. In general, the specific proportions and amounts of fluoride-containing compound(s), optional water, optional organic solvent(s), optional acid-base buffer(s), and optional chelator/passivation agent(s), in relation to each other, may be suitably varied to provide the desired removal action of the liquid composition for the SARC layer species and/or processing equipment, as readily determinable within the skill of the art without undue effort.

Compositions of the invention may be embodied in a wide variety of specific formulations, as hereinafter more fully described.

Compositions of embodiment B preferably have a pH value in a range from about 4 to about 9, preferably in a range from about 5 to about 7.

Such composition may optionally include additional components, including active as well as inactive ingredients, e.g., surfactants, stabilizers, dispersants, anti-oxidants, penetration agents, adjuvants, additives, fillers, excipients, etc.

In addition, it is also contemplated herein that the compositions of embodiment B may be formulated as foams, fogs, subcritical or supercritical fluids. For example, the compositions of embodiment B may be added to a supercritical fluid such as carbon dioxide in a ratio of about 100 parts SCF to 1 part embodiment B to about 6:1, preferably about 20:1.

A source of fluoride ion is needed since the presence of fluoride is necessary to etch silicate materials in acidic solutions. A neutral fluoride salt is preferred for safety of preparation and handling. Amine-hydrofluoride salts containing non-volatile amines are most preferred to avoid changes in pH due to evaporation of the amine. Suitable sources of fluoride-containing compounds include, but are not limited to, ammonium fluoride, triethylamine trihydrofluoride ($(C_2H_5)_3N.3HF$), methyldiethanolamine-hydrofluoric acid salt, triethanolamine-hydrofluoric acid salt, and hydroxyethylmorpholine-hydrofluoric acid salt. Alternatively, salts of bifluorides may be used, including ammonium bifluoride (($NH_4$)$HF_2$) and tetraalkylammonium bifluorides (($R$)$_4NHF_2$, where R is methyl, ethyl, butyl, phenyl or fluorinated $C_1$-$C_4$ alkyl groups). Combinations of two or more fluoride-containing compounds are also contemplated herein. In a preferred embodiment, the fluoride-containing compound is ammonium fluoride or methyldiethanolamine-hydrofluoric acid salt.

The organic solvent species serve as a solvent and assist in the dissolution of organic residues, which may be present in the SARC. Suitable solvent species for such composition include, without limitation: glycols and glycol ethers such as those enumerated hereinabove with regards to embodiment A; dimethylsulfoxide (DMSO); dimethylacetamide; and amines such as monoethanolamine, triethanolamine, triethylenediamine, methylethanolamine, methyldiethanolamine, pentamethyldiethylenetriamine, dimethyldiglycolamine, 1,8-diazabicyclo[5.4.0]undecene, aminopropylmorpholine, hydroxyethylmorpholine, aminoethylmorpholine, hydroxypropylmorpholine, diglycolamine, N-methylpyrrolidinone (NMP), N-octylpyrrolidinone, N-phenylpyrrolidinone, cyclohexylpyrrolidinone, imidazolidone, and vinyl pyrrolidinone. Combinations of two or more organic solvents are also contemplated herein. Preferably, the organic solvent includes diethylene glycol, dimethyldiglycol amine, diethyleneglycol methyl ether and NMP.

The acid/base buffer serves to stabilize the pH and control the etch rate selectivity of the solution towards SARC, other residues, and underlying materials such as dielectrics and interconnect metals. Organic acids useful in the buffering system of the instant invention include, but are not limited to: formic acid, trifluoroacetic acid, propionic acid, butyric acid, valeric acid, heptanoic acid, lactic acid, oxalic acid, malic acid, malonic acid, succinic acid, fumaric acid, adipic acid, benzoic acid, phthalic acid and citric acid. Conjugate bases useful in the buffering system of the present invention include, but are not limited to: a salt of the organic acid, and the amines listed hereinabove in the organic solvent(s) listing. Combinations of two or more acid/base buffers are also contemplated herein. In a preferred embodiment, the buffering system of the present invention comprises malonic acid and dimethyldiglycolamine.

The chelating agent(s) may be added to reduce the attack on the metals, e.g., copper and/or cobalt, in the underlying layers. The chelator/passivation agent in such composition can be of any suitable type, for example as listed hereinabove with regards to Embodiment A.

It is contemplated herein that water may be present in the removal composition of embodiment B even though no water was intentionally added thereto.

In various preferred embodiments, the removal composition of embodiment B is formulated in the following Formulations BA-BJ$^2$, wherein all percentages are by weight, based on the total weight of the formulation:

Formulation BA: 0.5% ammonium fluoride; 2.58% Malonic acid; 68.08% diethylene glycol; 3% dimethyldiglycol amine; 25.64% water; 0.2% 3-amino-5-mercapto-1,2,4-triazole Formulation BB: 0.5% ammonium fluoride; 2.58% Malonic acid; 68.08% diethylene glycol; 3% dimethyldiglycol amine; 25.64% water; 0.2% 4-methyl-2-phenylimidazole Formulation BC: 0.5% ammonium fluoride; 2.58% Malonic acid; 68.08% diethylene glycol; 3% dimethyldiglycol amine; 25.64% water; 0.2% 5-amino-1,3,4-thiadiazole-2-thiol

| constituent | Formulation | | | | | |
| --- | --- | --- | --- | --- | --- | --- |
| | BD | BE | BF | BG | BH | BI |
| ammonium fluoride | 0.5% | 0.5% | 0.5% | 0.5% | 0.5% | 0.5% |
| Malonic acid | 2.58% | 2.58% | 2.58% | 2.58% | 2.58% | 2.58% |
| diethylene glycol | 72.92% | 79.92% | 86.92% | 87.92% | 88.92% | 89.92% |
| dimethyldiglycol amine | 3% | 3% | 3% | 3% | 3% | 3% |
| water | 21% | 14% | 7% | 6% | 5% | 4% |

| constituent | Formulation | | | |
| --- | --- | --- | --- | --- |
| | BJ | BK | BL | BM |
| ammonium fluoride | 0.5% | 0.5% | 0.5% | 0.5% |
| Malonic acid | 2.58% | 2.58% | 2.58% | 2.58% |
| diethylene glycol | 90.92% | 91.92% | 92.92% | 93.92% |
| dimethyldiglycol amine | 3% | 3% | 3% | 3% |
| water | 3% | 2% | 1% | 0% |

| constituent | Formulation | | | |
| --- | --- | --- | --- | --- |
| | BN | BO | BP | BQ |
| ammonium fluoride | 0.5% | 0.5% | 0.5% | 0.5% |
| Malonic acid | 2.58% | 2.58% | 2.58% | 2.58% |
| diethylene glycol | 93.82% | 92.82% | 91.82% | 90.82% |
| dimethyldiglycol amine | 3% | 3% | 3% | 3% |
| water | 0% | 1% | 2% | 3% |
| 5-amino-1,3,4-thiadiazole-2-thiol | 0.1% | 0.1% | 0.1% | 0.1% |

Formulation BR: 2.0% ammonium fluoride; 2.58% Malonic acid; 89.52% diethylene glycol; 3% dimethyldiglycol amine; 2.9% citric acid Formulation BS: 1.0% ammonium fluoride; 5.16% Malonic acid; 87.84% diethylene glycol; 3% dimethyldiglycol amine; 3% maleic acid
Formulation BT: 75% methyldiethanolamine-hydrofluoric acid salt; 25% water
Formulation BU: 67.5% methyldiethanolamine-hydrofluoric acid salt; 22.5% water; 10% diethyleneglycol methyl ether
Formulation BV: 60% methyldiethanolamine-hydrofluoric acid salt; 20% water; 20% diethyleneglycol methyl ether
Formulation BW: 67.5% methyldiethanolamine-hydrofluoric acid salt; 22.5% water; 10% imidazolidone
Formulation BX: 60% methyldiethanolamine-hydrofluoric acid salt; 20% water; 20% NMP
Formulation BY: 74.85% methyldiethanolamine-hydrofluoric acid salt; 24.95% water; 0.2% 3-amino-5-mercapto-1,2,4-triazole
Formulation BZ: 74.85% methyldiethanolamine-hydrofluoric acid salt; 24.95% water; 0.2% 5-amino-1,3,4-thiadiazole-2-thiol
Formulation $BA^2$: 74.85% methyldiethanolamine-hydrofluoric acid salt; 24.95% water; 0.2% 4-methyl-4H-1,2,4-triazole-3-thiol
Formulation $BB^2$: 60% methyldiethanolamine-hydrofluoric acid salt; 20% water; 20% pentamethyldiethylenetriamine
Formulation $BC^2$: 59.88% methyldiethanolamine-hydrofluoric acid salt; 19.96% water; 19.96% NMP; 0.2% 5-amino-1,3,4-thiadiazole-2-thiol
Formulation $BD^2$: 59.88% methyldiethanolamine-hydrofluoric acid salt; 19.96% water; 19.96% NMP; 0.2% 4-methyl-4H-1,2,4-triazole-3-thiol
Formulation $BE^2$: 37.5% methyldiethanolamine-hydrofluoric acid salt; 18.75% triethanolamine-hydrofluoric acid salt; 22.1% hydroxyethylmorpholine-hydrofluoric acid salt; 21.65% water
Formulation $BF^2$: 60% methyldiethanolamine-hydrofluoric acid salt; 7.5% triethanolamine-hydrofluoric acid salt; 8.84% hydroxyethylmorpholine-hydrofluoric acid salt; 23.66% water
Formulation $BG^2$: 45% methyldiethanolamine-hydrofluoric acid salt; 29.88% methyldiethanolamine-phosphoric acid salt; 25.12% water
Formulation $BH^2$: 40.55% methyldiethanolamine-hydrofluoric acid salt; 26.89% methyldiethanolamine-phosphoric acid salt; 10% dimethylacetamide; 22.6% water
Formulation $BI^2$: 40.55% methyldiethanolamine-hydrofluoric acid salt; 26.89% methyldiethanolamine-phosphoric acid salt; 10% NMP; 22.6% water
Formulation $BJ^2$: 40.55% methyldiethanolamine-hydrofluoric acid salt; 26.89% methyldiethanolamine-phosphoric acid salt; 10% DMSO; 22.6% water In addition, it is contemplated herein that the compositions of embodiment B may be diluted with a solvent such as water and used as a post-chemical mechanical polishing (CMP) composition to remove post-CMP residue including, but not limited to, particles from the polishing slurry, carbon-rich particles, polishing pad particles, brush deloading particles, equipment materials of construction particles, copper, copper oxides, and any other materials that are the by-products of the CMP process.

The liquid removal compositions of the invention are easily formulated by simple addition of the respective ingredients and mixing to homogeneous condition. Furthermore, the liquid removal compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the liquid removal composition, i.e., more dilute or more concentrated, in the broad practice of the invention, and it will be appreciated that the liquid removal compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions of the invention. For example, the kit may include, in one or more containers, at least one fluoride-containing compound, optionally at least one organic solvent, optionally an acid-base buffer, optionally at least one chelator/passivation agent, for combining with the optional water at the fab or the point of use. Alternatively, the kit may include, in one or more containers, at least one fluoride-containing compound, optionally an acid-base buffer, optionally at least one chelator/passivation agent, for combining with the optional water and optional at least one organic solvent at the fab or the point of use. The containers of the kit must be suitable for storing and shipping said liquid removal compositions, for example, NOWPak® containers (Advanced Technology Materials, Inc., Danbury, Conn., USA).

In yet another embodiment, the liquid removal composition of embodiment B includes at least at least one fluoride-containing compound, for residue material removal, optionally at least one organic solvent, optionally an acid-base buffer, optionally at least one chelator/passivation agent, and optionally water, wherein the residue material includes SARC and/or post-etch residue. Importantly, the residue material may be dissolved and/or suspended in the liquid removal composition of the invention.

Method of Use of Liquid Removal Compositions

The removal compositions of the invention are easily formulated by simple addition of the respective ingredients and mixing to homogeneous condition.

In removal application, the removal composition is applied in any suitable manner to the microelectronic device to be cleaned, e.g., by spraying the removal composition on the surface of the microelectronic device, by dipping the microelectronic device in a volume of the cleaning composition, by contacting the microelectronic device to be cleaned with another material, e.g., a pad, or fibrous sorbent applicator element, that is saturated with the removal composition, by contacting the microelectronic device with a circulating removal composition, or by any other suitable means, manner or technique, by which the removal composition is brought into removal contact with microelectronic device to be cleaned.

As applied to semiconductor manufacturing operations, the cleaning compositions of the present invention are usefully employed to remove SARC and/or post-etch residue materials from microelectronic device structures having such material(s) thereon.

The compositions of the present invention, by virtue of their selectivity for such SARC materials, relative to other materials that may be present on the microelectronic device and exposed to the removal composition, such as ILD structures, metallization, barrier layers, etc., achieve at least partial removal of the SARC and/or post-etch residue material(s) in a highly efficient manner.

Importantly, the compositions of the present invention have a low amount of water, e.g., less than about 1 percent by weight, especially the compositions of Embodiment A and as such, are compatible with metal interconnect layers such as copper, aluminum and cobalt. The copper and/or cobalt etch rates in the presence of the compositions of the invention are preferably less than 5 Å/min, more preferably less than 2 Å/min, most preferably less than 1 Å/min.

In use of the compositions of the invention for removing SARC materials from microelectronic device substrates having same thereon, the cleaning composition typically is contacted with the device substrate for a time of from about 1 to about 60 minutes, preferably about 20 to about 30 minutes, at temperature in a range of from about 20° C. to about 80° C. Such contacting times and temperatures are illustrative, and any other suitable time and temperature conditions may be employed that are efficacious to at least partially remove the SARC material from the device substrate, within the broad practice of the invention. As defined herein, "at least partial removal" corresponds to at least 50% removal of SARC material, preferably at least 80% removal of SARC material. Most preferably, at least 90% of the SARC material is removed using the compositions of the present invention.

Following the achievement of the desired cleaning action, the cleaning composition is readily removed from the device to which it has previously been applied, e.g., by rinse, wash, or other removal step(s), as may be desired and efficacious in a given end use application of the compositions of the present invention. For example, the device may be rinsed with deionized water.

A still further embodiment of the invention relates to methods of manufacturing an article comprising a microelectronic device, said method comprising contacting the microelectronic device with a liquid removal composition for sufficient time to remove SARC and/or post-etch residue materials from the microelectronic device having said materials thereon, and incorporating said microelectronic device into said article, wherein the liquid removal composition includes at least one fluoride-containing compound, at least one organic solvent, optionally water, and optionally, at least one chelator/passivation agent.

Another embodiment of the invention relates to methods of manufacturing an article comprising a microelectronic device, said method comprising contacting the microelectronic device with a liquid removal composition for sufficient time to remove SARC and/or post-etch residue materials from the microelectronic device having said materials thereon, and incorporating said microelectronic device into said article, wherein the liquid removal composition includes at least one fluoride-containing compound, optionally at least one organic solvent, optionally an acid-base buffer, optionally at least one chelator/passivation agent, and optionally water.

The features and advantages of the invention are more fully shown by the illustrative examples discussed below.

Example 1

SARC removal was performed on samples of patterned low-k dielectric substrate including SARC layers. The samples were dipped in embodiment A removal solutions for 30 minutes at 40° C. (Tables 1 and 2) or 15 minutes at 20° C. (Table 3) and then rinsed with copious amounts of deionized water. The percent removal of SARC material from the patterned wafer was approximated using scanning electron microscopy. The results are tabulated in Tables 1-3 hereinbelow.

In addition to approximate removal of SARC layers from the patterned wafer, the etch rate of copper and/or cobalt metal in the removal solutions was determined Blanket metal wafers of copper and/or cobalt were dipped in the removal solution and the etch rate of the respective metal determined using four-point probe measurements based on resistivity. The results are tabulated in Table 1 hereinbelow.

TABLE 1

SARC Removal and Etch Rate Results

| Solution | SARC Removal 30 min, 40° C. | Cu Etch Rate 40° C., (Å/min) | Cobalt Etch Rate 40° C., (Å/min) |
|---|---|---|---|
| AH | 50% | 7.6 | not measured |
| AI | 95% | 1.4 | 3.9 |
| AJ | 40% | 1.7 | not measured |
| AL | 20% | not measured | not measured |
| AM | 75% | 1.2 | 1.36 |
| AN | 50% | 1.2 | 1.53 |
| AQ | 95% | 1.1 | 0.75 |

TABLE 2

SARC Removal Results

| Solution | SARC Removal 30 min, 40° C. |
|---|---|
| AP | 99% |
| AR | 98% |
| AS | 98% |
| AT | 99% |
| AU | 99% |
| AV | 100% |
| AW | 99% |
| AX | 95% |
| $AB^2$ | 100% |
| $AC^2$ | 100% |
| $AD^2$ | 100% |
| $AE^2$ | 100% |
| $AF^2$ | 100% |
| $AG^2$ | 100% |
| $AH^2$ | 100% |
| $AI^2$ | 100% |
| $AL^2$ | 100% |
| $AM^2$ | 100% |

TABLE 3

SARC Removal Results

| Solution | SARC Removal 20° C., 15 min |
|---|---|
| $AN^2$ | 98% |
| $AO^2$ | 98% |
| $AP^2$ | 98% |
| $AQ^2$ | 98% |
| $AR^2$ | 99% |
| $AS^2$ | 99% |
| $AT^2$ | 98% |
| $AU^2$ | 98% |
| $AV^2$ | 98% |
| $AW^2$ | 99% |
| $AX^2$ | 100% |

Example 2

The etch rate of copper and/or cobalt metal in the removal solutions of embodiment B was experimentally determined Blanket metal wafers of copper and/or cobalt were dipped in the removal solution and the etch rate of the respective metal determined using a galvanic cell. The results are tabulated in Table 4 hereinbelow.

TABLE 4

Metals Compatibility.

| Solution | Cu Etch Rate (Å/min) | Co Etch Rate (Å/min) |
|---|---|---|
| BD | 0.59 | 6.81 |
| BE | 0.39 | 5.83 |
| BF | 0.28 | 5.11 |
| BG | 0.39 | 5.82 |
| BH | 0.38 | 5.38 |
| BI | 0.34 | 5.27 |
| BJ | 0.33 | 4.57 |
| BK | 0.34 | 3.54 |
| BL | 0.26 | 1.72 |
| BM | 0.26 | 0.59 |

Example 3

Dielectric material, copper and cobalt etch rates were determined following the static immersion of blanketed dielectric, copper and cobalt wafers in formulations $AL^2$ and $AM^2$ for 30 minutes at 40° C. The etch rates were determined using electrochemically derived Tafel plots.

In formulation $AL^2$, the etch rates of dielectric material, cobalt, and copper were determined to be 1.7 Å $min^{-1}$, 0.043 Å $min^{-1}$, and 0.07 Å $min^{-1}$, respectively. In formulation $AM^2$, the etch rates of dielectric material, cobalt, and copper were determined to be 0.6 Å $min^{-1}$, 0.028 Å $min^{-1}$, and 0.055 Å $min^{-1}$, respectively.

Accordingly, while the invention has been described herein in reference to specific aspects, features and illustrative embodiments of the invention, it will be appreciated that the utility of the invention is not thus limited, but rather extends to and encompasses numerous other aspects, features, and embodiments. Accordingly, the claims hereafter set forth are intended to be correspondingly broadly construed, as including all such aspects, features and embodiments, within their spirit and scope.

What is claimed is:

1. A liquid removal composition, consisting of about 0.35 wt % to about 0.75 wt % of at least one fluoride-containing compound, about 8.5 wt % to about 73.5 wt % of at least one alcohol, about 25 wt % to about 90 wt % of at least one glycol, and about 0.35 wt % to about 0.8 wt % of water, based on the total weight of the composition, wherein the at least one alcohol is selected from the group consisting of 1-propanol, 2-propanol, 1-butanol, 2-butanol, t-butanol, 1-pentanol, and combinations thereof, wherein the at least one glycol is selected from the group consisting of 1,4-butanediol, neopentyl glycol, and combinations thereof, and wherein said liquid removal composition is useful for removing sacrificial anti-reflective coating (SARC) materials and post-etch residue from a microelectronic device having such materials and residue thereon.

2. The liquid removal composition of claim 1, wherein the at least one alcohol is selected from the group consisting of 1-butanol, 2-butanol, t-butanol, 1-pentanol, and combinations thereof.

3. The liquid removal composition of claim 1, wherein the at least one fluoride-containing compound is selected from the group consisting of hydrogen fluoride, ammonium fluoride, triethanolamine hydrofluoric acid salt, ammonium bifluoride, tetraalkylammonium bifluorides $((R)_4NHF_2)$, and combinations thereof, wherein R is selected from the group consisting of methyl, ethyl, propyl, butyl, phenyl, benzyl, and fluorinated $C_1$-$C_4$ alkyl groups.

4. The liquid removal composition of claim 1, wherein the at least one alcohol is 1-butanol.

5. The liquid removal composition of claim 1, wherein the at least one glycol is 1,4-butanediol.

6. The liquid removal composition of claim 1, consisting of 1-butanol, 1,4-butanediol, hydrogen fluoride, and water.

7. The liquid removal composition of claim 1, wherein the pH of the composition is in a range from about 1 to about 5.

8. A method of removing SARC material and/or post-etch residue from a microelectronic device having said material and residue thereon, said method comprising contacting the microelectronic device with a liquid removal composition for sufficient time to at least partially remove said material and residue from the microelectronic device, and wherein the liquid removal composition consists of about 0.35 wt % to about 0.75 wt % of at least one fluoride-containing compound, about 8.5 wt % to about 73.5 wt % of at least one alcohol, about 25 wt % to about 90 wt % of at least one glycol, and about 0.35 wt % to about 0.8 wt % of water, based on the total weight of the composition, wherein the at least one alcohol is selected from the group consisting of 1 propanol, 2-propanol, 1-butanol, 2-butanol, t-butanol, 1-pentanol, and combinations thereof, and wherein the at least one glycol is selected from the group consisting of 1,4-butanediol, neopentyl glycol, and combinations thereof.

9. The method of claim 8, wherein the at least one alcohol is selected from the group consisting of 1-butanol, 2-butanol, t-butanol, 1-pentanol, and combinations thereof.

10. The method of claim 8, wherein said contacting is carried out for a time of from about 1 minute to about 60 minutes.

11. The method of claim 8, wherein said contacting is carried out at temperature in a range of from about 20° C. to about 80° C.

12. The method of claim 8, wherein the at least one fluoride-containing compound is selected from the group consisting of hydrogen fluoride, ammonium fluoride, triethanolamine hydrofluoric acid salt, ammonium bifluoride, tetraalkylammonium bifluorides $((R)_4NHF_2)$, and combinations thereof, wherein R is selected from the group consisting of methyl, ethyl, propyl, butyl, phenyl, benzyl, and fluorinated $C_1$-$C_4$ alkyl groups.

13. The method of claim 8, wherein the pH of the composition is in a range from about 1 to about 5.

14. The method of claim 8, further comprising rinsing the microelectronic device with deionized water following contact with the liquid removal composition.

* * * * *